US009288590B2

(12) United States Patent
Kim et al.

(10) Patent No.: US 9,288,590 B2
(45) Date of Patent: Mar. 15, 2016

(54) HEARING DEVICE AND METHOD OF LOW POWER OPERATION THEREOF

(71) Applicant: SAMSUNG ELECTRONICS CO., LTD., Suwon-si (KR)

(72) Inventors: Sang Wook Kim, Seoul (KR); Jun Il Sohn, Yongin-si (KR); Dong Wook Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/242,598

(22) Filed: Apr. 1, 2014

(65) Prior Publication Data

US 2015/0043762 A1     Feb. 12, 2015

(30) Foreign Application Priority Data

Aug. 9, 2013 (KR) .......................... 10-2013-0094935

(51) Int. Cl.
| | | |
|---|---|---|
| H04R 25/00 | (2006.01) | |
| H04R 5/00 | (2006.01) | |
| H03G 1/02 | (2006.01) | |
| G10L 21/0316 | (2013.01) | |
| G10L 17/00 | (2013.01) | |

(52) U.S. Cl.
CPC .......... *H04R 25/558* (2013.01); *G10L 21/0316* (2013.01); *H03G 1/02* (2013.01); *H04R 25/405* (2013.01); *H04R 25/552* (2013.01); *G10L 17/00* (2013.01); *H04R 2225/61* (2013.01); *H04R 2430/01* (2013.01); *H04R 2460/03* (2013.01); *H04R 2460/13* (2013.01)

(58) Field of Classification Search
CPC .......... H04R 1/22; H04R 25/00; H04R 25/02; H04R 25/353; H04R 25/356; H04R 25/40; H04R 25/402; H04R 25/405; H04R 25/407; H04R 25/552; H04R 2225/00; H04R 2225/021; H04R 2225/023; H04R 2225/025; H04R 2225/41; H04R 2225/43; H04R 2225/49; H04R 2225/51; H04R 2225/53; H04R 2225/59; H04R 2430/01; H04R 2460/03; H04R 2460/13; G10L 17/00; G10L 21/0316; H03G 1/02
USPC .......................... 381/23.1, 95, 96, 97, 98, 104
See application file for complete search history.

(56) References Cited

U.S. PATENT DOCUMENTS

| | | | |
|---|---|---|---|
| 4,187,413 A * | 2/1980 | Moser ............................ | 381/320 |
| 4,531,229 A * | 7/1985 | Coulter ......................... | 381/23.1 |
| 4,955,729 A * | 9/1990 | Marx ............................. | 381/322 |
| 5,390,254 A * | 2/1995 | Adelman ....................... | 381/315 |
| 5,434,924 A * | 7/1995 | Jampolsky .................... | 381/23.1 |
| 8,284,970 B2 * | 10/2012 | Sacha ............................ | 381/315 |
| 2007/0009122 A1 * | 1/2007 | Hamacher ..................... | 381/312 |
| 2007/0010704 A1 * | 1/2007 | Pitulia ............................ | 600/23 |
| 2007/0189561 A1 * | 8/2007 | Dijkstra et al. ............... | 381/315 |
| 2007/0253578 A1 * | 11/2007 | Verdecanna et al. .......... | 381/104 |
| 2008/0253594 A1 * | 10/2008 | Rasmussen et al. .......... | 381/312 |
| 2009/0209304 A1 * | 8/2009 | Ngia et al. .................. | 455/575.2 |
| 2010/0135512 A1 * | 6/2010 | Haenggi et al. .............. | 381/315 |
| 2010/0260364 A1 * | 10/2010 | Merks ........................... | 381/313 |
| 2011/0046948 A1 * | 2/2011 | Pedersen ....................... | 704/231 |

(Continued)

*Primary Examiner* — Khai N Nguyen
(74) *Attorney, Agent, or Firm* — NSIP Law (57) ABSTRACT

A hearing device, an acoustic apparatus and a sound processing method thereof are provided. The method includes detecting audio signals, determining whether the audio signals include a voice signal of a user, and controlling amplification of the audio signals according to a result of the determination.

20 Claims, 6 Drawing Sheets

(56) References Cited

U.S. PATENT DOCUMENTS

| | | | |
|---|---|---|---|
| 2011/0237295 A1* | 9/2011 | Bartkowiak et al. | 455/556.1 |
| 2012/0051553 A1* | 3/2012 | Sohn et al. | 381/71.1 |
| 2012/0070008 A1* | 3/2012 | Sohn et al. | 381/23.1 |
| 2012/0163639 A1* | 6/2012 | Ito | 381/313 |
| 2013/0051565 A1* | 2/2013 | Pontoppidan | 381/23.1 |
| 2013/0188816 A1* | 7/2013 | Bouse | 381/320 |
| 2014/0270200 A1* | 9/2014 | Usher et al. | 381/57 |
| 2014/0321682 A1* | 10/2014 | Kofod-Hansen et al. | 381/315 |

* cited by examiner

HEARING DEVICE AND METHOD OF LOW POWER OPERATION THEREOF

CROSS-REFERENCE TO RELATED APPLICATION(S)

This application claims the benefit under 35 USC 119(a) of Korean Patent Application No. 10-2013-0094935 filed on Aug. 9, 2013, in the Korean Intellectual Property Office, the entire disclosure of which is incorporated herein by reference for all purposes.

BACKGROUND

1. Field

The following description relates to a hearing device, a method of processing audio signals, and a method and apparatus of low power operation of a hearing device.

2. Description of Related Art

A hearing device is used to assist a user who is wearing the device to hear sound from surroundings more clearly. A hearing device is designed to receive a sound wave through a microphone, and to output the received sound wave to the user after processing and amplifying the sound wave.

With the development of integrated circuits (ICs) and hearing device fitting technology, some hearing devices are now capable of providing an amount of gain and an type of output that are appropriate for a type and degree of hearing loss experienced by the user. Further, the sizes of available hearing devices have been reduced.

Hearing devices are produced in various forms, such as a glasses type hearing device for mounting to a glasses frame, a behind-the-ear (BTE) type hearing device for wearing on an ear, and a completely-in-canal (CIC) type hearing device for insertion into an ear.

Some hearing devices are powered by batteries. The batteries may be rechargeable. Recently, researches are underway on low power operation of the hearing device to increase a use time of hearing devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, there is provided a method of processing signals in a hearing device, the method involving detecting audio signals, determining whether the audio signals include a voice signal of a user, and controlling amplification of the audio signals according to a result of the determination.

The detecting of the audio signals may involve detecting the audio signals through at least two microphones.

The determining may involve determining whether the audio signals include the voice signal of the user based on at least one of time difference information and level difference information of the detected audio signals.

The time difference information may be interaural time difference (ITD) information of the detected audio signals, and the level difference information may be interaural level difference (ILD) information of the detected audio signals.

The determining may involve determining whether the detected audio signals include the voice signal of the user by detecting a mouth movement of the user.

The determining may involve determining whether the detected audio signals include the voice signal of the user by recognizing voice characteristic of the user.

The controlling may involve setting at least one flag with respect to the voice signal of the user and other signals.

The controlling may involve setting an amplification level of the voice signal of the user to be lower than an amplification level of other audio signals.

The setting of the amplification level of the voice signal of the user may involve setting the amplification level of the voice signal of the user such that the voice signal of the user is not amplified.

The general aspect of the method may further involve setting an operation mode of the hearing device, in which the determining may involve determining whether the audio signals are the voice signal of the user in response to the operation mode being a low power mode.

The setting of the operation mode may involve setting the operation mode to the low power mode in response to receiving an input by the user through a user interface (UI).

The UI may include at least one of a predetermined button disposed on at least one of the hearing device and an external device connected to the hearing device through a wired or wireless communication channel, a touch panel of at least one of the hearing device and the external device, and a microphone included in the hearing device.

In another general aspect, a non-transitory computer-readable medium may include a program for instructing a computer to perform the method described above.

In another general aspect, a hearing device may include an audio signal detection unit configured to detect audio signals, a voice signal determination unit configured to determine whether the audio signals include a voice signal of a user of the hearing device, and an amplification control unit configured to control amplification of the audio signals according to a result of the determination.

The audio signal detection unit may include an audio signal detector configured to detect audio signals received from at least two microphones.

The voice signal determination unit may be configured to determine whether the audio signals include the voice signal of the user based on at least one of time difference information and level difference information of the detected audio signals.

The amplification control unit may include an amplification level setter configured to set an amplification level of the voice signal to be lower than an amplification level of other audio signals.

The amplification level setter may be configured to set the amplification level of the voice signal of the user such that the voice signal is not amplified.

The general aspect of the hearing device may further include an operation mode setter configured to set an operation mode of the hearing device, and the voice signal determination unit may be configured to determine whether the audio signals include the voice signal of the user in response to the operation mode being a low power mode.

The operation mode setter may be configured to set the operation mode to the low power mode in response to receiving an input by the user through a user interface (UI).

In another general aspect, there is provided an apparatus including microphones configured to detect sound, and an amplification control unit configured to control amplification of the sound according to whether the sound includes a voice signal of a user of the apparatus.

The amplification control unit may be configured to set an amplification level of the voice signal of the user to be lower than an amplification level of other signals in the detected sound.

Whether the sound includes the voice signal of the user may be determined by comparing interaural time difference (ITD) information of signals in the detected sound or by comparing interaural level difference (ILD) information of signals in the detected sound.

Other features and aspects will be apparent from the following detailed description, the drawings, and the claims.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art In the following description, a hearing device refers to an apparatus that provides an audio signal to a user by being detachably affixed to, disposed in a close proximity of, or contacting an ear of the user. A hearing device may include a hearing aid that amplifies an audio signal generated outside and assists the user wearing the hearing aid to perceive the audio signal more clearly by delivering an amplified version of the audio signal. A hearing device may include a system that supports a hearing aid function. Examples of such a system include a mobile device, a television (TV), and a consumer electronics/information technology (CE/IT) device, a plug-in accessory or hearing aid module having a sound or broadcasting relay function with respect to a hearing assistance, and a hearing aid chip.

A hearing device may be a monaural device that generates an audio signal at one ear of the user or a binaural device that generates an audio signal at both ears of the user. A binaural device may include a pair of units or receivers, so that each unit may pair with an ear of the user.

According to an example, a hearing device may operate in a general mode or in a low power mode. The general mode refers to an operation mode for performing a general function of the hearing device, such as a general hearing aid function. The low power mode refers to an operation mode for determining whether an audio signal is a voice signal of a user and controlling the amplification of the audio signal according to the result of the determination. Hereinafter, a hearing device that operates in a low power mode will be described.

Figure 1:
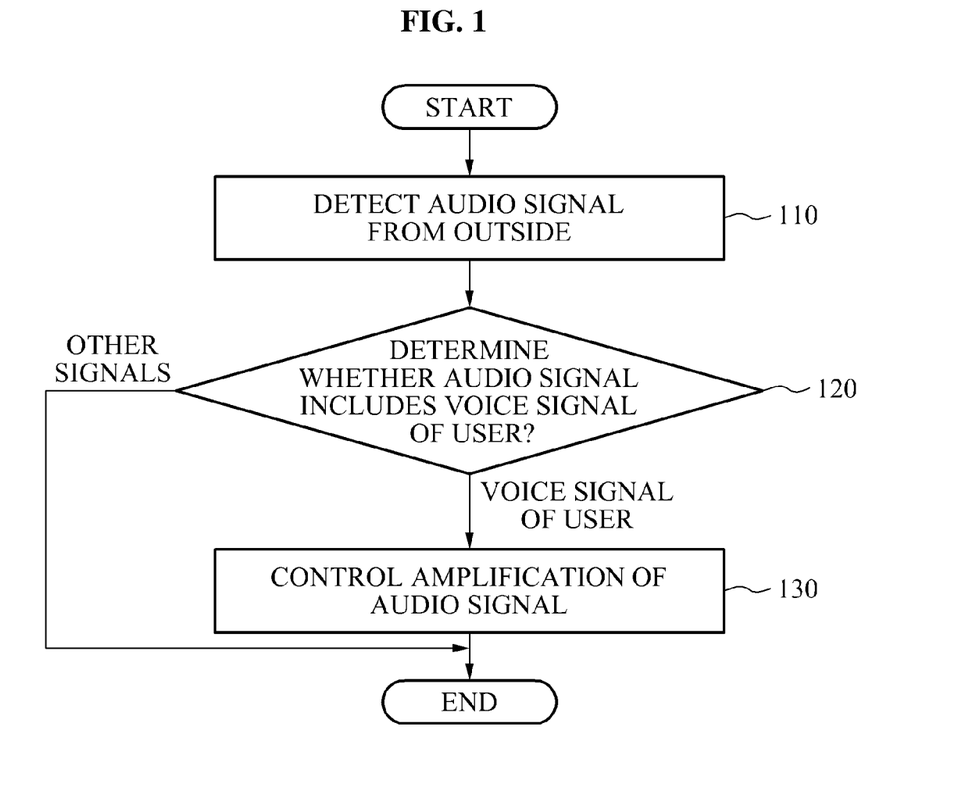
FIG. 1 is a flowchart illustrating an example of a low power operation method for a hearing device.

FIG. 1 illustrates an example of a low power operation method for a hearing device.

Referring to FIG. 1, in 110, the low power operation method may involve detecting audio signals from outside. In this example, the outside refers to sources of sound other than the hearing device 100, including the user, a person speaking with the user, other devices producing sound, sounds from environment such as traffic noise and the like. The hearing device may include at least two microphones and may detect audio signals received through the at least two microphones. In a hearing device that is a binaural hearing device, a left hearing unit and a right hearing unit included in the binaural hearing device may each include at least one microphone. In a hearing device that is a monaural hearing device, the hearing device may include at least two microphones. In this example, the at least two microphones may be disposed at two or more different positions inside the hearing device. With the increase in the number of microphones provided in a hearing device, it is possible to perform the detection of time difference information or level difference information more accurately. Accordingly, some examples of hearing device include more than two microphones.

In one example, the hearing device may detect a voice signal from the user, as well as audio signals from another source such as a conversation partner of the user. In such an event, the sources of sound may be plural, and the sources may be located in different positions from each other.

The hearing device may convert the detected audio signals in an analog form into digital signals.

In addition, in 120, the low power operation method may involve determining whether any of audio signals received corresponds to the voice of the user. That is, the received audio signals should be analyzed to determine whether it includes or corresponds to the voice signal of the user.

In 120, the hearing device may calculate at least one of the time difference information and the level difference information of the detected audio signals, thereby determining whether any of the detected audio signals corresponds to the voice signal of the user. The time difference information of the audio signals may include information regarding a phase difference between the audio signals.

In a monaural device, the hearing device may calculate location related information regarding the source of the audio signals using the relative positions of the at least two microphones. Since the at least two microphones are disposed in different positions, audio signals received by the respective microphones may have different characteristics. For example, an audio signal that is generated from one source may be detected at the respective microphones such that the detected signals have different time-related information, phases, or sound levels or amplitude from each other. The hearing device may calculate valuable information regarding the audio signals by calculating the time difference, phase difference, or level difference of the audio signals detected by the two or more microphones.

In a binaural device, the hearing device may calculate the information on the audio signals using a difference in characteristics of an audio signal detected by at least one microphone included in a left hearing unit and an audio signal detected by at least one microphone included in a right hearing unit. In this example, time difference information of the detected audio signals may refer to interaural time difference (ITD) information of the detected audio signals, and level difference information of the detected audio signals may refer to interaural level difference (ILD) information of the detected audio signals.

Because the hearing device is disposed at an ear of the user, the time difference, the phase difference, or the level difference of a voice signal of the user may be relatively greater than those of an audio signal generated from other sources.

The hearing device may determine whether the audio signals are the voice signal of the user by comparing at least one of the time difference information and the level difference information with a predetermined reference value. According to an example, the hearing device may compare the at least one of the time difference information and the level difference information with a predetermined reference value. The predetermined reference value may be a time difference information or a level difference information calculated in advance according to a distance between a mouth and the ear of a user when the hearing device is fitted at the ear, or according to a distance between a mouth and an ear of a hypothetical user. When the time difference information or the level difference information of the detected audio signals is greater than the predetermined reference value, the hearing device may determine that the audio signals to be the voice signal of the user. When the time difference information or the level difference information is smaller than or equal to the predetermined reference value, the hearing device may determine that the audio signals to be other audio signals than the voice signal of the user.

In another example, the hearing device may include a lookup table recording predetermined time difference information or the level difference information according to a distance between the hearing device and the source. In this example, the source may include the user. The time difference information or the level difference information of the audio signals according to the distance may be calculated and recorded in the lookup table in advance. The time difference information or the level difference information recorded in the lookup table may be a predetermined range. The hearing device may compare the time difference information or the level difference information according to the distance recorded in the lookup table with the time difference information or the level difference information of the detected audio signals to determine the source of sound. For instance, in the event that the similarity between the time difference information or the level difference information according to the distance and the time difference information or the level difference information of the detected audio signals is higher than or equal to the predetermined range, the audio signals may be determined to be the voice of the user. In the event that the similarity is lower than the predetermined range, the audio signals may be determined to be audio signals other than the voice of the user.

In addition, in 120, the hearing device may determine whether the audio signals are the voice signal of the user through the detection of a mouth movement of the user. The voice signal of the user may be generated and articulated through the shape of the mouth of the user. Therefore, when the hearing device detects an audio signal upon detecting a movement of the mouth of the user, the audio signal may be determined to the voice signal of the user.

In an example, the hearing device may detect the mouth movement of the user by using a bone conduction sensor. Bone conduction refers to the conduction of sound to an inner ear through the bones of the skull. A bone conduction sensor may be included in the hearing device to detect a sound that is generated as the user speaks. For example, the bone conduction sensor may be designed to detect a jawbone movement that occurs while the user speaks. When the audio signal is detected along with the jawbone movement, the hearing device may determine the audio signal to be the voice of the user. In an example, a voice of a speaking person that the speaking person hears is a combination of a voice signal coming into the ear of the person as the voice propagates in the air and a voice signal coming into an inner ear of the person through bone conduction occurring as the skull transmits the sound by being vibrated by the sound generated in the person's vocal folds, vocal tract and mouth. The bone conduction sensor may detect the voice signal that is transmitted to the inner ear of the person through bone conduction. A microphone may detect the voice signal coming into the ear by propagation in the air. In response to the voice signal being detected by the microphone together with the voice signal being transmitted to the inner ear by bone conduction, as determined by the bone conduction sensor, the hearing device may determine that the detected voice signal corresponds to the voice signal of the user.

In addition, in 120, the hearing device may determine whether the audio signals are the user's voice by recognizing certain characteristics of the voice of the user. For example, the hearing device may perform speaker recognition to determine whether the audio signals are the voice of the user.

The hearing device may store characteristics of the user's voice in advance. The hearing device may detect the audio signal from the outside using the microphone, and may compare characteristics of the detected audio signal with the stored characteristics of the voice signal of the user. As a result of the determination, when similarity between the characteristics of the audio signal and the characteristics of the voice signal is higher than a predetermined value, the hearing device may determine the audio signal to be the user's voice. When the similarity is lower than or equal to the predetermined value, the hearing device may determine the audio signal to be other audio signals than the user's voice.

Furthermore, according to one example, the hearing device may have more than one operation modes. As aforementioned, the general mode refers to an operation mode for performing general functions of the hearing device, and the low power mode refers to an operation mode for controlling amplification of the audio signal by determining whether the audio signal is the voice signal of the user. The hearing device may operate in the low power mode as a default or may be set to operate in the low power mode through a user interface (UI). The hearing device may receive an input of the user through the UI. In response to receiving an input of the user, the hearing device may set its operation mode to the low power mode.

In an example, the UI may include at least one of a predetermined button disposed on at least one of the hearing device and an external device connected to the hearing device through a wired or wireless communication channel, a touch panel of at least one of the hearing device and an external device connected to the hearing device through a wired or wireless communication channel, and the microphone included in the hearing device.

For example, when the predetermined button disposed at the hearing device or a remote controller is pressed in the general mode, the hearing device may set the operation mode to the low power mode. In response to the predetermined button disposed at the hearing device being pressed during the low power mode, the hearing device may set the operation mode to the general mode. In another example, in a state that the hearing device and a mobile device is connected through a wireless communication channel, when a touch input by the user is detected from a touch panel included in the mobile device, the hearing device may set the operation mode to the low power mode. As yet another example, the hearing device may set the audio signal for entering the low power mode in advance. When detecting the audio signal using the microphone, the hearing device may compare the detected audio signal with a predetermined audio signal. In the event that the detected audio signal is relatively similar to the predetermined audio signal, the hearing device may set the operation mode to the low power mode. In the event that the detected audio signal is distinguishable from the predetermined audio signal, the hearing device may set or maintain the general mode.

In 130, the low power operation method may control amplification of the audio signal according to a result of determination of 120.

In 130, the hearing device may separate the voice signal of the user from signals other than the user's voice from among the detected audio signals. In 130, the hearing device may set a flag with respect to at least one of the voice signal and the other audio signals. For example, the hearing device may set a first flag indicating a voice signal with respect to the voice signal among the detected audio signals and may set a second flag indicating a non-voice signal with respect to the other audio signals among the detected audio signals. In another example, the hearing device may set the flag with respect to the voice signal while not setting the flag with respect to the other audio signals. Using the flag, the hearing device may recognize the voice signal of the user among the detected audio signals.

In 130, the hearing device may set different amplification levels with respect to the voice signal of the user and the other audio signals among the detected audio signals. In one example, the hearing device may set an amplification level of the voice signal to be lower than an amplification level of the other audio signals. In addition, the hearing device may set the amplification level of the voice signal of the user so that the voice signal is not amplified. A general hearing device equally sets amplification levels of the voice signal of the user and the other audio signals. Because the user is already aware of the voice signal of himself or herself, when the voice signal of the user is amplified by the same amplification level as the other audio signals, the amplified voice signal may be recognized as a noise to the user. In addition, amplification of the voice signal may increase power consumption of the hearing device. Accordingly, the hearing device may reduce power consumption by setting the amplification level of the voice signal of the user to be lower than the amplification level of the other audio signals, and may provide the user with necessary audio signals more efficiently.

In one example, the hearing device may set the amplification levels of the voice signal and the other audio signals according to a predetermined ratio, or set the amplification level of the voice signal according to a predetermined reference value.

In another example, the hearing device may set the amplification levels of the voice signal and the other audio signals by sensing a surrounding environment. For example, when the surrounding environment is noisy, the hearing device may sense the noisy environment and may increase the amplification level of the other audio signals in comparison to when the surrounding environment is a normal environment. When the surrounding environment is quiet, the hearing device may reduce the amplification level of the other audio signals lower than when the surrounding environment is a normal environment, and transmit the audio signal to the user. The hearing device may set the amplification level of the voice signal of the user to be lower than the amplification level of the other audio signals by sensing the surrounding environment.

The hearing device may amplify the voice signal of the user and the other audio signals according to the set amplification levels, and then convert the amplified voice signal and other audio signals from a digital form into an analog form. The hearing device may provide the analog signal to the user through a receiver.

Figure 2:
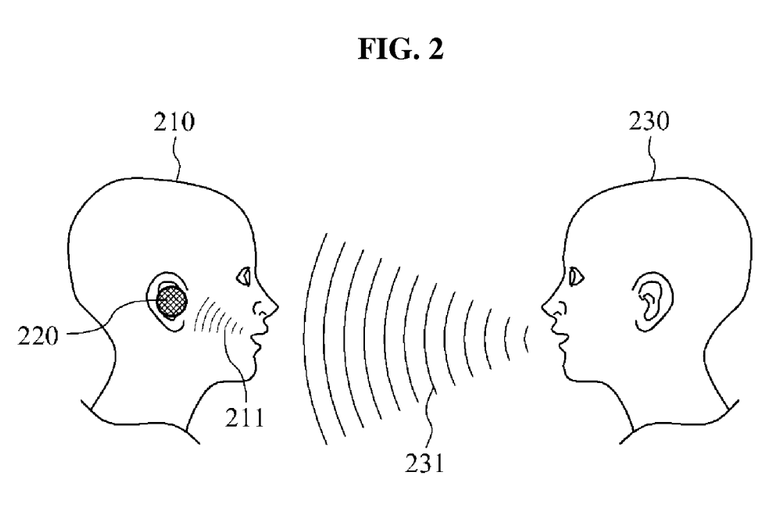
FIG. 2 is a diagram illustrating an example of a method of determining whether an audio signal is a voice signal.

FIG. 2 illustrates an example of a method of determining a source of a voice signal.

Referring to FIG. 2, when a user 210 and a partner 230 are conversing with each other, a hearing device 220 may detect a voice signal 211 of the user 210 and a voice signal 231 of the partner 230 using at least two microphones included in the hearing device 220. The hearing device 220 may separate the voice signal 211 and the voice signal 231 from each other based on at least one of time difference information and level difference information of detected audio signals. In a hearing device 220 that is a binaural device, the hearing device 220 may separate the voice signal 211 and the voice signal 231 based on at least one of ITD information and ILD information of the detected audio signals.

Because the hearing device 220 is disposed in an ear of the user 210, a time difference or level difference of the audio signal 211 of the user 210 may be greater than a time difference or level difference of the audio signal 231 of the partner 230. For example, the hearing device 220 may detect the voice signal 211 of the user 210 and the voice signal 231 of the partner 230. For instance, presuming that a distance between the hearing device 220 and a mouth of the user 210 from which the voice signal 211 is generated is about 10 cm while a distance between the hearing device 220 and a mouth of the partner 230 is about 1 m, since the distance between the mouth of the partner 230 and the hearing device 220 is almost ten times the distance between the mouth of the user 210 and the hearing device 220, the level difference of the voice signal 211 may be about a hundred times the amplification level of the voice signal 231, according to relationships between undulation of the voice signal and the distance.

The time difference information or the level difference information of the voice signal 211 may be greater than a predetermined reference value. Accordingly, the hearing device 220 may determine the voice signal 211 to be a voice signal of the user. Because the time difference information or the level difference information of the voice signal 231 may be smaller than or equal to the predetermined reference value, the hearing device 220 may determine the voice signal 231 to be not the voice signal of the user.

Figure 3A:
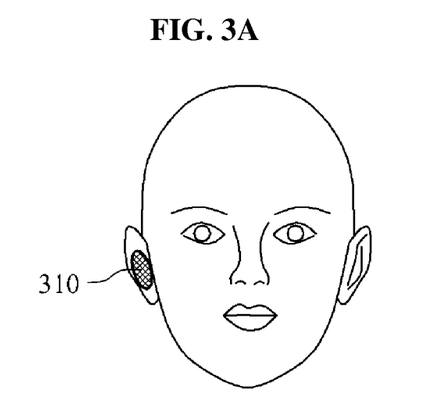
FIGS. 3A and 3B are diagrams illustrating another example of a method of determining whether an audio signal is a voice signal.
Figure 3B:
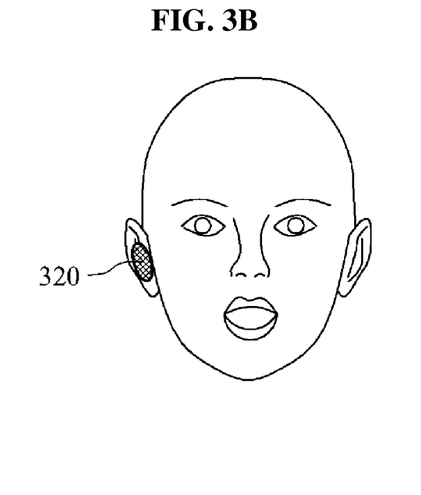

FIGS. 3A and 3B illustrate another example of a method of determining whether an audio signal corresponds to a voice signal of the user.

Referring to FIGS. 3A and 3B, a hearing device 310 may be disposed at an ear of a user. In FIG. 3A, the user is not speaking and therefore the hearing device 310 may detect an audio signal generated from another source.

In FIG. 3B, the user may move his or her mouth to articulate a sound as he or she speaks. In one example, the hearing device 320 may detect a movement of the mouth along with a voice signal of the user. For example, the hearing device 320 may detect a movement of a jawbone of the user using a bone conduction sensor included in the hearing device 320. In response to an audio signal from an outside being detected together with the movement of the mouth, the hearing device 320 may determine the audio signal detected from the outside to be the voice signal of the user.

In another example, the hearing device 320 may store characteristics of the voice signal of the user in advance. The hearing device 320 may detect the audio signal from the outside, and may compare characteristics of the detected audio signal with the stored characteristics of the voice signal of the user. In the event that it is determined that the characteristics of the detected audio signal and the characteristics of the voice signal are relatively similar to each other, the hearing device 320 may determine the detected audio signal to correspond to the user's voice. In the event that the characteristics of the detected audio signal and the characteristics of the voice signal are not similar, the hearing device 320 may determine the detected audio signal to be not the voice signal of the user.

Figure 4A:
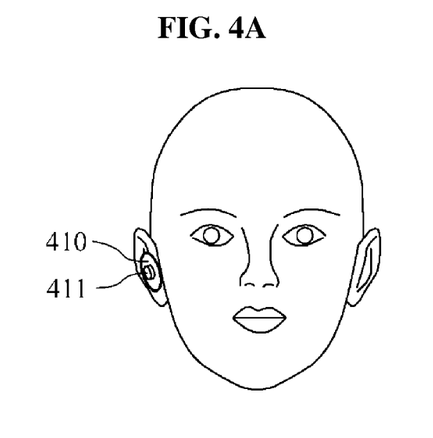
FIGS. 4A to 4C are diagrams illustrating an example of a method of setting an operation mode of a hearing device.
Figure 4B:
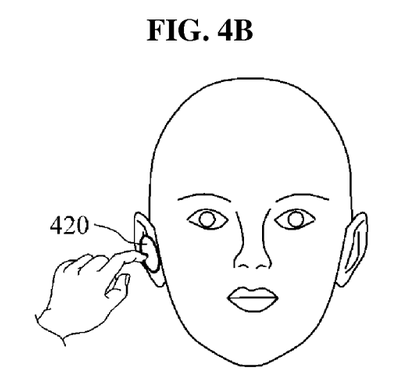
Figure 4C:
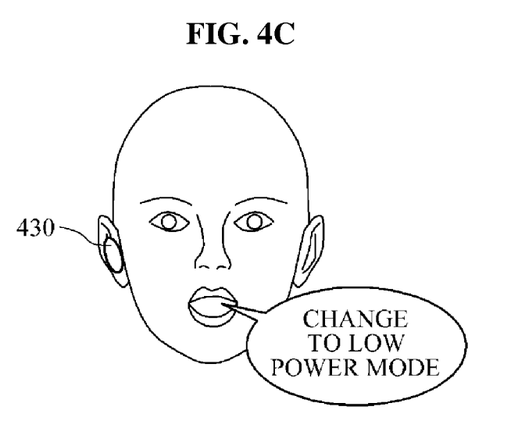

FIGS. 4A to 4C illustrate an example of a method of setting of an operation mode of a hearing device.

Referring to FIG. 4A, a hearing device 410 may include a button 411. In response to a user pressing the button 411 during a general mode of the hearing device 410, the hearing device 410 may detect an input of the button 411 and may convert the operation mode into a low power mode. In the event that the user presses the button 411 again, the hearing device 410 may detect the input of the button 411 and may convert the operation mode back into the general mode.

In FIG. 4B, a hearing device 420 may include a touch sensor. The touch sensor may detect a touch input of the user. In the event that a touch input of the user is detected during the general mode, the hearing device 420 may set the operation mode to the low power mode. In the event that the touch input of the user is detected during the low power mode, the hearing device 420 may set the operation mode to the general mode.

In FIG. 4C, a hearing device 430 may use a preset audio signal to enter the low power mode. The audio signal may be set in advance, for instance, by a user. For example, the audio signal for entering the low power mode may be a voice signal corresponding to a command such as the phrase "change to low power mode." The hearing device 430 may detect an audio signal from the outside using a microphone included in the hearing device 430. The hearing device 430 may recognize the voice signal in the general mode and may compare the voice signal with the audio signal for entering the low power mode. In the event that the recognized voice signal is the voice signal corresponding to the phrase "change to low power mode", the hearing device 430 may change the operation mode from the general mode to the low power mode.

Figure 5:
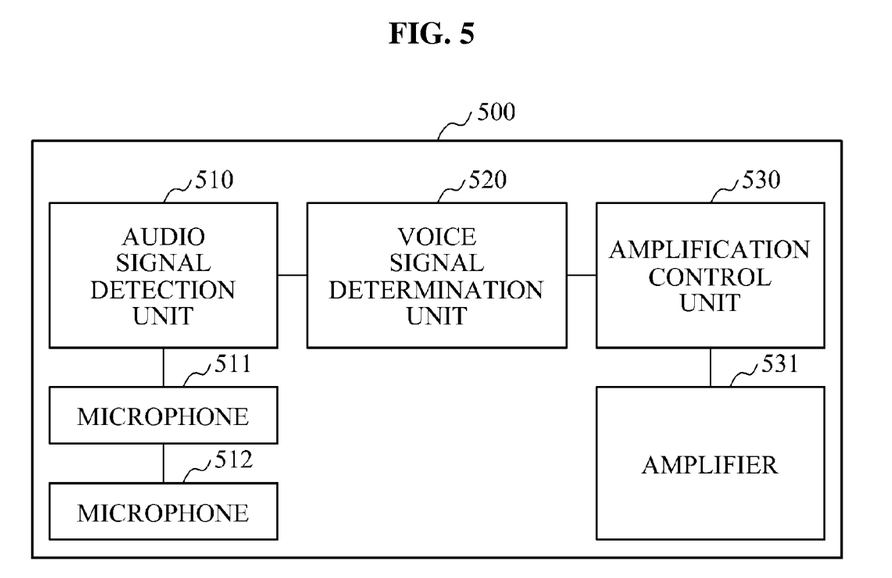
FIG. 5 is a block diagram illustrating an example of a hearing device.

FIG. 5 is a block diagram illustrating an example of a hearing device 500.

Referring to FIG. 5, the hearing device 500 may include an audio signal detection unit 510, a voice signal determination unit 520, and an amplification control unit 530.

The audio signal detection unit 510 may detect an audio signal from the outside. The audio signal detection unit 510 may include an audio signal detector (not shown) that detects audio signals received by at least two microphones 511, 512.

The voice signal determination unit 520 may determine whether the audio signal corresponds to the voice of a user. The voice signal determination unit 520 may determine the audio signal based on at least one of time difference information and level difference information of detected audio signals. In the event that the operation mode is set to a low power mode, the voice signal determination unit 520 may determine whether the audio signal is the voice signal of the user before amplifying the audio signal.

The amplification control unit 530 may control the amplification of the audio signal according to the determination result of the voice signal determination unit 520. The amplification control unit 530 may include an amplification level setter (not shown) that sets an amplification level of the voice signal to be lower than an amplification level of other audio signals. The amplification level setter may set the amplification level of the voice signal of the user so that the voice signal of the user is not amplified. Thus, audio signals other than the voice signal of the user may be amplified by the amplifier 531 and be delivered to the user.

The hearing device 500 shown in FIG. 5 may further include an operation mode setter (not shown) that sets an operation mode of the hearing device 500. The operation mode setter may set the operation mode to the low power mode based on a predetermined input of a user that is received through a UI.

The technical features illustrated with reference to FIGS. 1 to 4 are applicable to the hearing device 500 illustrated in FIG. 5. Thus, a detailed description about the hearing device 500 will be omitted for conciseness.

Figure 6:
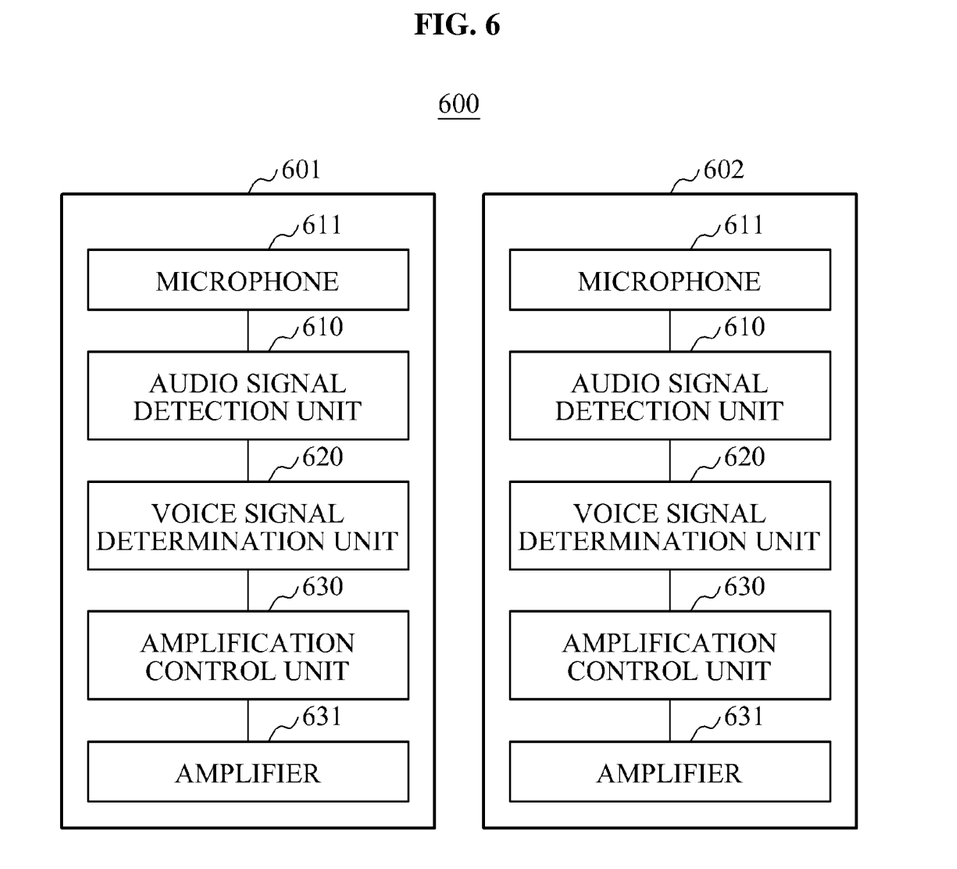
FIG. 6 is a block diagram illustrating another example of a hearing device.

FIG. 6 is a block diagram illustrating another example of a hearing device 600. The hearing device 600 is a binaural hearing device having a first unit 601 and a second unit 602. Each of the first unit 601 and the second unit 602 include an audio signal detection unit 610, at least one microphone 611, a voice signal determination unit 620, an amplification control unit 630, and an amplifier 631. The first unit 601 and the second unit 602 may exchange information via a wired or wireless communication. Further, in other examples, the voice signal determination unit 620 may be present in only one unit, or be placed outside of the first unit 601 and the second unit 602.

The voice signal determination unit 620 may determine whether an audio signal detected through the microphone 611 corresponds to the voice of a user, and the amplification control unit 630 may control the amplification of the audio signal according to the determination result of the voice signal determination unit 620. The amplifier 631 may amplify an auditory signal as directed by the amplification control unit 630. The foregoing description regarding the voice signal determination and amplification control with reference to FIGS. 1 to 5 is applicable to the binaural hearing device 600 illustrated in FIG. 6. Thus, a detailed description thereof will be omitted for conciseness.

The above-described examples may be recorded, stored, or fixed in one or more non-transitory computer-readable media that includes program instructions to be implemented by a computer to cause a processor to execute or perform the program instructions. The media may also include, alone or in combination with the program instructions, data files, data structures, and the like. The program instructions recorded on the media may be those specially designed and constructed, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above, or vice versa.

The units described above may be implemented using hardware components and software components. For example, microphones, amplifiers, band-pass filters, audio to digital convertors, and processing devices may be included in the units. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of processing signals in a hearing device comprising a processor, the method comprising:
   detecting audio signals through at least two microphones, wherein the two microphones comprise a first microphone and a second microphone, and wherein the audio signals comprise first audio signals at the first microphone and second audio signals at the second microphone;
   determining, controlled by the processor, whether the audio signals include a voice signal of a user by comparing the first audio signals with the second audio signals based on at least one of time difference information and level difference information of the detected audio signals; and
   controlling amplification of the audio signals according to a result of the determination,
   wherein the controlling comprises setting an amplification level of the voice signal of the user such that the voice signal of the user is not amplified.

2. The method of claim 1, wherein
   the time difference information is interaural time difference (ITD) information of the detected audio signals, and
   the level difference information is interaural level difference (ILD) information of the detected audio signals.

3. The method of claim 1, wherein the determining comprises:
   determining whether the detected audio signals include the voice signal of the user by detecting a mouth movement of the user.

4. The method of claim 1, wherein the determining comprises:
   determining whether the detected audio signals include the voice signal of the user by recognizing a voice characteristic of the user.

5. The method of claim 1, wherein the controlling comprises:
   setting at least one flag with respect to the voice signal of the user and other signals.

6. The method of claim 1, wherein the setting of the amplification level of the voice signal of the user comprises: setting the amplification level of the audio signal based on a sensed noise level of a surrounding environment.

7. The method of claim 1, further comprising:
   setting an operation mode of the hearing device,
   wherein the determining comprises determining whether the audio signals are the voice signal of the user in response to the operation mode being a low power mode.

8. The method of claim 7, wherein the setting of the operation mode comprises:
   setting the operation mode to the low power mode in response to receiving an input by the user through a user interface (UI).

9. The method of claim 8, wherein the UI comprises at least one of a predetermined button disposed on at least one of the hearing device, an external device connected to the hearing device through a wired or wireless communication channel, a touch panel of at least one of the hearing device and the external device, and a microphone included in the hearing device.

10. A non-transitory computer-readable medium comprising a program for instructing a computer to perform the method of claim 1.

11. A hearing device comprising:
    an audio signal detection unit configured to detect audio signals through at least two microphones, wherein the two microphones comprise a first microphone and a second microphone, and wherein the audio signals comprise first audio signals at the first microphone and second audio signals at the second microphone;
    a voice signal determination unit configured to determine whether the audio signals include a voice signal of a user of the hearing device by comparing the first audio signals with the second audio signals based on at least one of time difference information and level difference information of the detected audio signals; and
    an amplification control unit configured to control amplification of the audio signals according to a result of the determination,
    wherein the amplification control unit comprises an amplification level setter configured to set an amplification level of the voice signal to be lower than an amplification level of other audio signals.

12. The hearing device of claim 11, wherein the audio signal detection unit comprises an audio signal detector configured to detect the audio signals received from the at least two microphones.

13. The hearing device of claim 12, wherein the voice signal determination unit is configured to determine whether the audio signals include the voice signal of the user based on at least one of time difference information and level difference information between the first audio signals and the second audio signals.

14. The hearing device of claim 11, wherein the amplification control unit comprises an amplification level setter configured to set an amplification level of the voice signal to be lower than an amplification level of other audio signals.

15. The hearing device of claim 14, wherein the amplification level setter is configured to set the amplification level of the voice signal of the user such that the voice signal is not amplified.

16. The hearing device of claim 11, further comprising:
an operation mode setter configured to set an operation mode of the hearing device,
wherein the voice signal determination unit is configured to determine whether the audio signals include the voice signal of the user in response to the operation mode being a low power mode.

17. The hearing device of claim 16, wherein the operation mode setter is configured to set the operation mode to the low power mode in response to receiving an input by the user through a user interface (UI).

18. An apparatus comprising:
at least two microphones configured to detect sound, wherein the two microphones comprise a first microphone and a second microphone, and wherein the sound comprises first audio signals at the first microphone and second audio signals at the second microphone; and
an amplification control unit, comprising a processor, and configured to control amplification of the sound according to whether the sound includes a voice signal of a user of the apparatus by comparing the first audio signal with the second audio signal based on at least one of time difference information and level difference information of the detected audio signals,
wherein the amplification control unit comprises an amplification level setter configured to set an amplification level of the voice signal to be lower than an amplification level of other audio signals.

19. The apparatus of claim 18, wherein the amplification control unit is configured to set an amplification level of the voice signal of the user to be lower than an amplification level of other signals in the detected sound.

20. The apparatus of claim 18, wherein whether the sound includes the voice signal of the user is determined by comparing interaural time difference (ITD) information of signals in the detected sound or by comparing interaural level difference (ILD) information of signals in the detected sound.

* * * * *